United States Patent
Wang

(10) Patent No.: US 8,671,562 B2
(45) Date of Patent: Mar. 18, 2014

(54) METHOD FOR MANUFACTURING A CIRCUIT BOARD

(75) Inventor: Chien Hao Wang, Hsinchu County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 1188 days.

(21) Appl. No.: 11/967,847

(22) Filed: Dec. 31, 2007

(65) Prior Publication Data

US 2008/0155819 A1    Jul. 3, 2008

(30) Foreign Application Priority Data

Jan. 2, 2007   (TW) .............................. 096100110 A

(51) Int. Cl.
*H05K 3/02*    (2006.01)

(52) U.S. Cl.
USPC .................... 29/846; 29/825; 29/847; 29/848; 204/486; 204/488

(58) Field of Classification Search
USPC ............. 29/825, 846, 847, 848; 204/486, 488
See application file for complete search history.

(56) References Cited

U.S. PATENT DOCUMENTS

| | | | | |
|---|---|---|---|---|
| 4,592,816 A | * | 6/1986 | Emmons et al. | 204/478 |
| 4,746,399 A | * | 5/1988 | Demmer et al. | 216/17 |
| 4,861,438 A | * | 8/1989 | Banks et al. | 205/125 |
| 5,004,672 A | * | 4/1991 | D'Ottavio et al. | 205/184 |
| 5,288,377 A | * | 2/1994 | Johnson et al. | 204/486 |
| 5,510,010 A | * | 4/1996 | Kobor | 204/488 |
| 5,786,986 A | * | 7/1998 | Bregman et al. | 361/719 |
| 6,266,874 B1 | * | 7/2001 | DiStefano et al. | 29/846 |
| 6,426,146 B1 | * | 7/2002 | Ameen et al. | 428/413 |
| 6,828,224 B2 | * | 12/2004 | Iijima et al. | 438/622 |
| 6,908,684 B2 | * | 6/2005 | Angelopoulos et al. | 428/457 |
| 7,232,959 B2 | | 6/2007 | Hsu | |
| 2003/0184979 A1 | | 10/2003 | Tsai et al. | |

FOREIGN PATENT DOCUMENTS

| TW | 561797 B | 11/2003 |
|---|---|---|
| TW | 574738 B | 2/2004 |
| TW | 237536 B | 8/2005 |

\* cited by examiner

*Primary Examiner* — Carl Arbes

(57) ABSTRACT

A method for manufacturing a circuit board includes the steps of: forming a first wiring layer on a substrate; forming an insulating layer on the surface of the first wiring layer by means of electrophoretic deposition; forming a second wiring layer on the insulating layer and the surface of the substrate; and performing the follow-up procedures, such as forming a solder mask; thereby reducing the thickness of the circuit board and increasing the density of the circuit layout.

20 Claims, 7 Drawing Sheets

METHOD FOR MANUFACTURING A CIRCUIT BOARD

CROSS REFERENCE TO RELATED APPLICATION

This application claims the priority benefit of Taiwan Patent Application Serial Number 096100110, filed on Jan. 2, 2007, the full disclosure of which is incorporated herein by reference.

BACKGROUND OF THE INVENTION

1. Field of the Invention

This invention generally relates to a method for manufacturing a circuit board, and more particularly, to a method for manufacturing a circuit board by means of electrophoretic deposition.

2. Description of the Related Art

Accompanying with the development of technologies and improvement of life quality, the requirements of the electronic products by consumers are not only to be powerful but also to be light, compact and lower-energy consuming. Accordingly, the integration of commercial electronic products has become higher and the function thereof has become powerful.

In order to conform to the trend aforementioned, circuit boards of the electronic devices packaged inside electronic products are developed gradually from single layer to multilayers, e.g. two layers, four layers, eight layers or even more than ten layers, such that the electronic devices can be mounted on the circuit boards with higher density so as to miniaturize the electronic products.

Referring to FIGS. 1A to 1C, they schematically illustrate a conventional method for manufacturing a circuit board, and a circuit board with four wiring layers is taken as an example herein. Referring to FIG. 1A, a substrate 10 is provided and a first wiring layer 11 is formed respectively on the front and back sides of the substrate 10, wherein the first wiring layer 11 is formed by means of lithography, developing and etching processes know in the art.

Referring to FIG. 1B, after the first wiring layers 11 are formed on both sides of the substrate 10, an insulating dielectric layer 12 and a copper foil 13 which is attached on the dielectric layer 12 are laminated on the first wiring layer 11 and partially on the substrate 10, wherein the dielectric layer 12 may be a prepreg.

Referring to FIG. 1C, after the dielectric layer 12 and the copper foil 13 are laminated on both sides of the substrate 10, the copper foil 13 is processed with lithography, developing and etching processes so as to form a second wiring layer 14. Then a solder mask layer 15 is formed on the second wiring layer 14 so as to prevent the metal lines from oxidation and arc-welding short-circuit, wherein the solder mask layer 15 is exposed metal lines which are formed through the processes of exposure, developing and partially removing the solder mask layer 15.

Finally, a Pb—Sn layer or a Ni/Au layer is formed on the surfaces of the exposed metal lines so as to protect the lines and be served as contacts 17 for outward connection. In addition, a plurality of through holes 17 can be drilled between the first wiring layer 11 and the second wiring layer 14 for providing electrical connection therebetween.

In the conventional circuit boards, the dielectric layer 12 has a predetermined thickness, generally about 40 micrometers (or from 40 to 100 micrometers). Therefore, if the thickness of the dielectric layer 12 can be reduced, the circuit board can be lighter and more compact. At the same time, more numbers of wiring layers can be manufactured inside a circuit board within a predetermined thickness limitation so as to increase the integration.

Therefore, it is necessary to provide a practical and effective method to solve the insufficient aspects in the art.

SUMMARY OF THE INVENTION

It is an object of the present invention to provide a method for manufacturing a thicker circuit board.

It is another object of the present invention to provide a method for manufacturing a circuit board which can increase the density of circuit layout within a predetermined thickness.

The method for manufacturing a circuit board provided by the present invention includes the steps of: forming a first wiring layer on a substrate; forming an insulating layer on the surface of the first wiring layer by means of electrophoretic deposition; and forming a second wiring layer on the insulating layer and the surface of the substrate.

The present invention further provides a method for manufacturing a circuit board including the following steps: firstly, providing a substrate; forming a first wiring layer respectively on the front and back sides of the substrate; forming an insulating layer on the surface of the first wiring layer by means of electrophoretic deposition; next, forming a second wiring layer on the insulating layer and the substrate; then, forming a solder mask layer on the second wiring layer; and performing a photolithography process to expose portion of the second wiring layer to form a plurality of contacts.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1A:
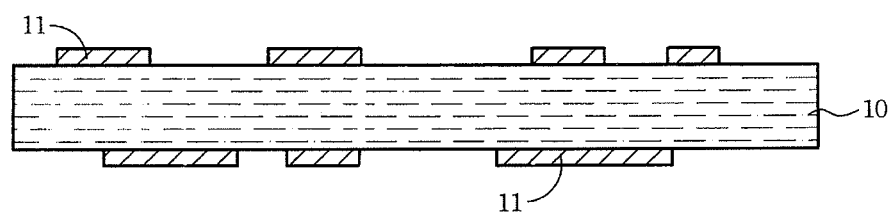
FIG. 1A shows a cross-sectional view of a circuit board for illustrating a conventional method for manufacturing a circuit board.
Figure 1B:
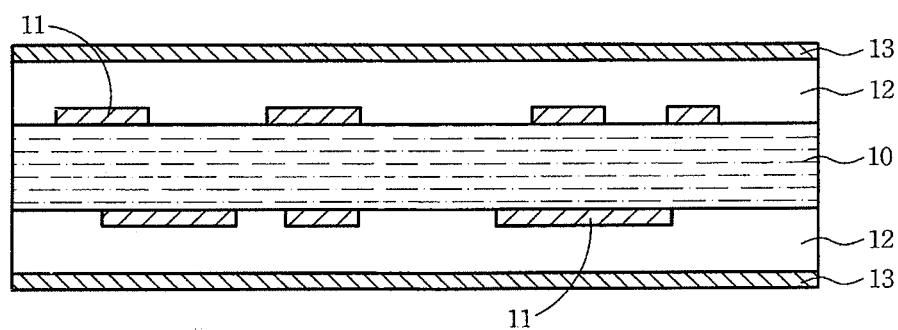
FIG. 1B shows another cross-sectional view of a circuit board for illustrating a conventional method for manufacturing a circuit board.
Figure 1C:
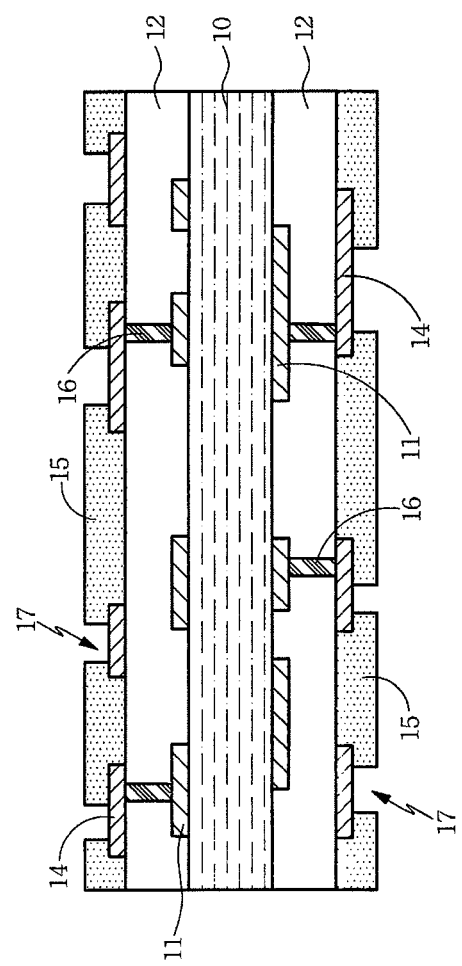
FIG. 1C shows further another cross-sectional view of a circuit board for illustrating a conventional method for manufacturing a circuit board.
Figure 2A:
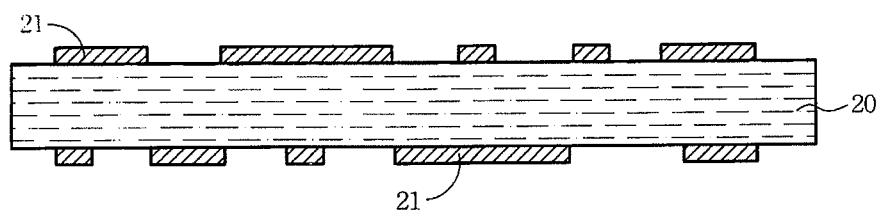
FIG. 2A shows a cross-sectional view of a circuit board for illustrating a method for manufacturing a circuit board according to one embodiment of the present invention.
Figure 2B:
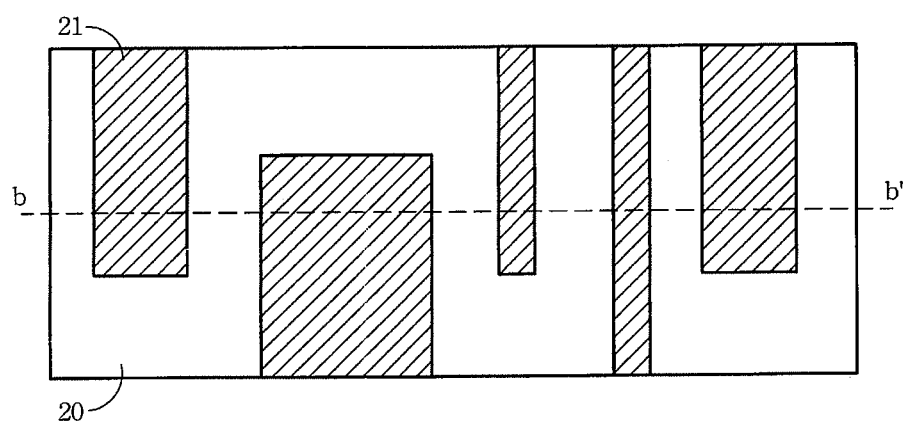
FIG. 2B shows a top view of the circuit board shown in FIG. 2A.

Referring to FIGS. 2A to 6, they illustrate schematic views of a method for manufacturing a circuit board according to the present invention. Referring to FIG. 2A, first a substrate 20 is provided and the substrate 20 may be a BT substrate, an FR4 substrate or the like. Next, a first wiring layer 21 is respectively formed on the front and back sides of the substrate 20. In addition, referring to FIG. 2B, which is a top view of FIG. 2A, it is shown that the first wiring layer 21 forms an interlaced distribution on the substrate 20. Furthermore, FIG. 2A is a cross-sectional view taken on the line b-b' of FIG. 2B.

The first wiring layer 21 is formed by the procedures including forming a metal layer respectively on the front and back sides of the substrate 20 at first, and then forming a photoresist pattern on the metal layer; next partially etching the metal layer to leave the desired image pattern of the metal layer; and finally removing the photoresist pattern so as to form the first wiring layer 21. In the above procedures, the metal layer may be formed by electroplating or electroless plating, and the photoresist pattern may be a dry film.

Figure 3A:
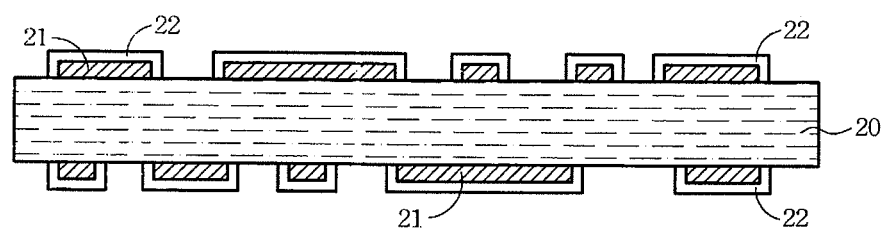
FIG. 3A shows another cross-sectional view of a circuit board for illustrating a method for manufacturing a circuit board according to one embodiment of the present invention.

Referring to FIG. 3A, after the first wiring layer 21 is formed on the substrate 20, an electrophoretic deposition process is performed so as to form an insulating layer 22 on the surface of the first wiring layer 21. The insulating layer 22 is served as a dielectric layer between the first wiring layer 21 and other wiring layers.

Figure 3B:
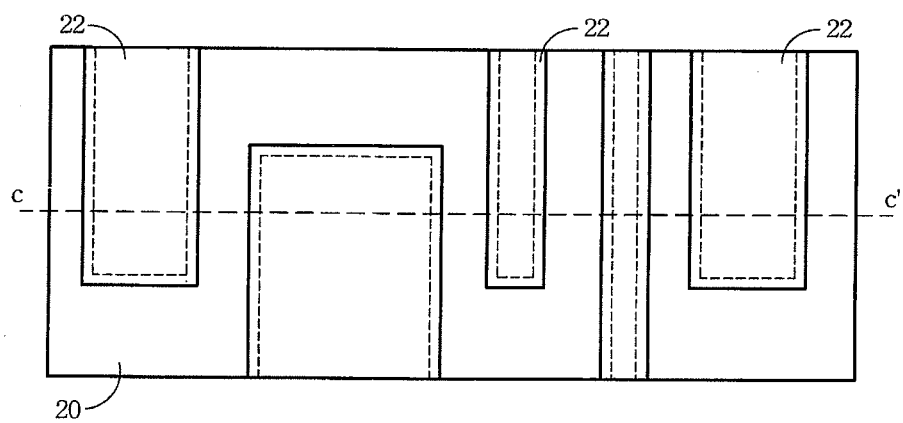
FIG. 3B shows a top view of the circuit board shown in FIG. 3A.

It should be noted that, the insulating layer 22 is formed only on the surface of the first wiring layer 21 without being formed on the surface of the substrate 20. Referring to FIG. 3B, which is a top view of FIG. 3A, it shows that the insulating layer 21 covers only the first wiring layer 21. Similarly, FIG. 3A is a cross-sectional view taken on the line c-c' of FIG. 3B.

The aforementioned electrophoretic deposition process further includes the steps of: depositing polymer micelles on the surface of the first wiring layer 21 and performing a heating procedure to polymerize the polymer micelles to form the insulating layer 22.

The polymer micelles are dispersed in a solution at first and then electrophoretically deposited on the surface of the first wiring layer 21 by means of the effect of electric fields. Because the polymer micelles dispersing in the solution are unpolymerized polymer, the polymer micelles are still colloid when they are deposited on the surface of the first wiring layer 21. Therefore, a heating procedure including at least a dehydration process and a cyclization process is performed such that the polymer micelles can be polymerized to form the required high polymers.

The polymer micelles include silicon-oxide inorganic particles and polymer precursors, and the polymer precursors are selected from the group of a polyimide resin and derivatives thereof, an epoxy resin and derivatives thereof, a polymer resin containing halogen, and a flame resistant polymer resin containing phosphorus, silicon and sulfur.

One merit of the electrophoretic deposition process is that the insulating layer is formed only on the wiring layer without being formed on the substrate, and the deposit thickness of the insulating layer can be controlled even below 10 micrometers according to the depositing current, depositing voltage or depositing time.

Figure 4A:
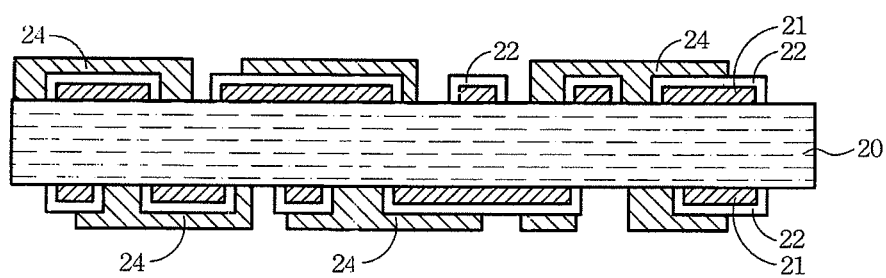
FIG. 4A shows further another cross-sectional view of a circuit board for illustrating a method for manufacturing a circuit board according to one embodiment of the present invention.

Referring to FIG. 4A, after the insulating layer 22 is formed on the surface of the first wiring layer 21, a second wiring layer 24 is then formed on the insulating layer 22 and the substrate 20. Since the insulating layer 22 is formed only on the surface of the first wiring layer 21, the second wiring layer 24 can be formed not only on the insulating layer 22 but on the substrate 20, and this is the difference between the present invention and conventional methods.

The second wiring layer 24 is formed by the procedures including forming a metal layer respectively on the front and back sides of the substrate 20 and the insulating layer 22 at first, and then forming a photoresist pattern on the metal layer; next partially etching the metal layer to leave the desired image pattern of the metal layer; and finally removing the photoresist pattern so as to form the second wiring layer 24. In the above procedures, the metal layer may be formed by electroplating or electroless plating, and the photoresist pattern may be a dry film.

Figure 4B:
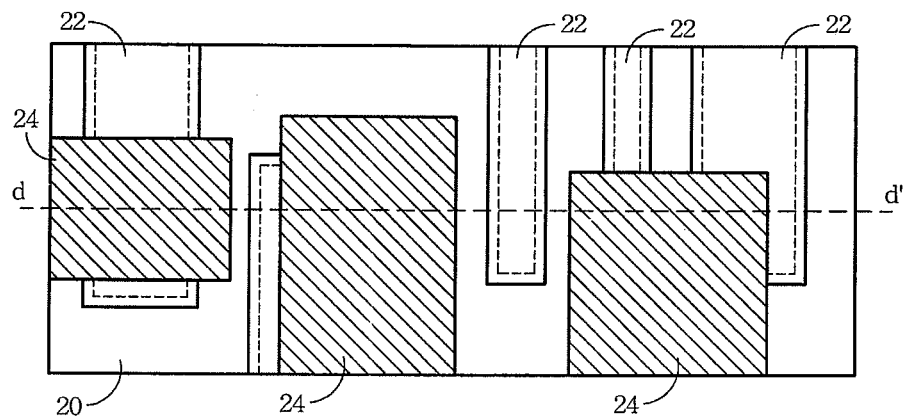
FIG. 4B shows a top view of the circuit board shown in FIG. 4A.

Referring to FIG. 4B which is a top view of FIG. 4A. Similarly, FIG. 4A is a cross-sectional view taken on the line d-d' of FIG. 4B. It should be noted that, a distribution between the second wiring layer 24 and the first wiring layer 21 can be an interlaced knit distribution or an overlap distribution as shown in FIG. 4B. The insulating layer 22 sandwiched between the first wiring layer 21 and the second wiring layer 24 is thick enough to form capacitance between the overlapped parts of the two wiring layers.

Figure 5:
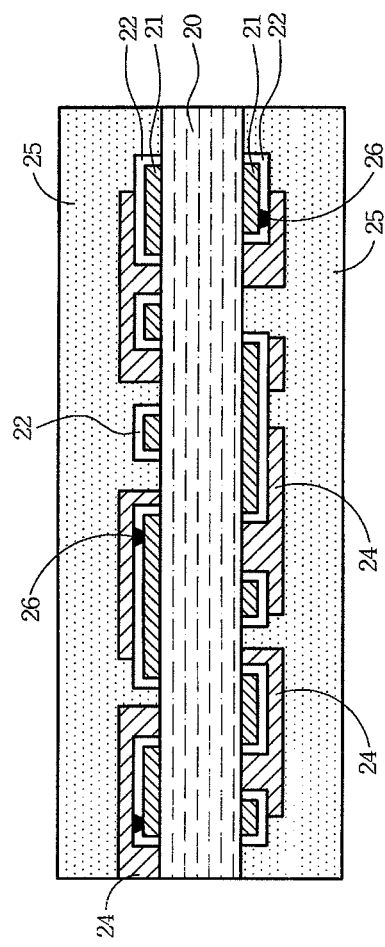
FIG. 5 shows further another cross-sectional view of a circuit board for illustrating a method for manufacturing a circuit board according to one embodiment of the present invention.

Referring to FIG. 5, after the outer wiring layer is formed, it is necessary to form an insulating protective layer thereon so as to prevent the wiring layer from oxidization and arc-welding short-circuit. In this manner, after the second wiring layer 24 is formed on the insulating layer 22 and the substrate 20, a dielectric layer 25 is attached respectively on the front and back sides of the substrate 20 and the second wiring layer 24 using a lamination process so as to protect the wiring layer; wherein the material of the dielectric layer 25 may be an insulating resin material.

Figure 6:
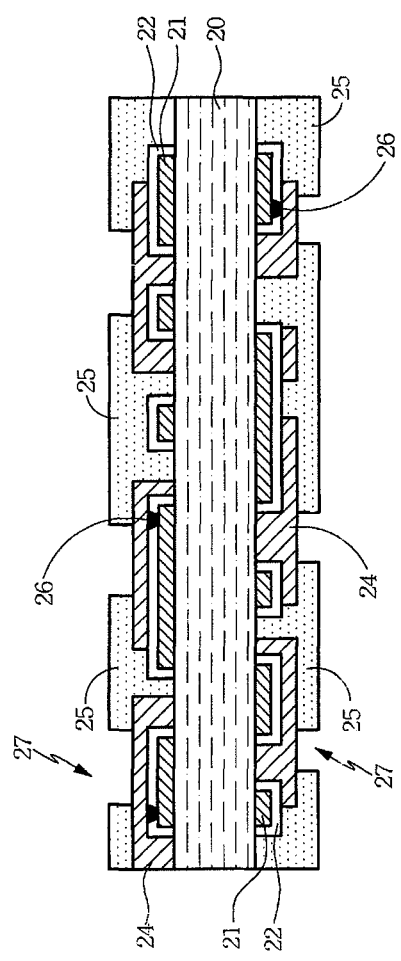
FIG. 6 shows a cross-sectional view of a circuit board for illustrating a method for manufacturing a circuit board according to an alternative embodiment of the present invention.

Generally speaking, the above dielectric layer 25 may also be a solder mask layer 25. Referring to FIG. 6, the second wiring layer 24 can be partially exposed by exposure and developing processes (photolithographic process) to form a plurality of openings to expose portion of the second wiring layer 24 to form a plurality of contacts 27 for outward connection since the material of the solder mask layer 25 is a photosensitive insulating material.

A Pb—Sn layer or a Ni/Au layer can be formed on the surfaces of the exposed metal lines so as to protect the lines and be served as the contacts 27 for outward connection. In addition, a plurality of through holes 26 can be drilled in the insulating layer 22 sandwiched between the first wiring layer 21 and the second wiring layer 22 for providing electrical connection between the first wiring layer 21 and the second wiring layer 22 according to product requirements.

In addition, it should be noted that the present invention is not limited to the above mentioned exemplary circuit board with four wiring layers. The present invention can also be adapted to the circuit board with more than four wiring layers and the dielectric layers sandwiched between two adjacent wiring layers are formed by means of electrophoretic deposition.

As described above, in the method for manufacturing a circuit board provided by the present invention, an insulating layer formed by electrophoretic deposition is utilized to replace the dielectric layer formed by lamination in the conventional method. Generally, the thickness of the dielectric layer formed by the conventional method is about 40 micrometers (or in the range from 40 to 100 micrometers);

however, the thickness of the insulating layer formed by the present invention is less than 30 micrometers or even less than 10 micrometers.

Accordingly, the thickness of the circuit board can be significantly and effectively decreased by using the present invention. Furthermore, more number and higher intensity of wiring layers can be manufactured within a predetermined thickness so as to increase the density of circuit layout thereby conforming to the trend towards realizing light, compact, low-energy consuming and powerful electronic devices.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for manufacturing a circuit board, comprising:
   forming a first wiring layer on a surface of a substrate;
   forming, by electrophoretic deposition, an insulating layer on a surface of the first wiring layer, wherein the insulating layer exposes a portion of the surface of the substrate; and
   forming a second wiring layer directly on both the insulating layer and the exposed portion of the surface of the substrate.

2. The method for manufacturing a circuit board as claimed in claim 1, wherein the forming the first wiring layer on the surface of the substrate further comprises:
   forming a metal layer on the substrate;
   forming a photoresist pattern on the metal layer;
   etching the metal layer; and
   removing the photoresist pattern.

3. The method for manufacturing a circuit board as claimed in claim 2, wherein the metal layer is formed by electroplating or electroless plating.

4. The method of claim 1, wherein after forming a second wiring layer directly on both the insulating layer and the exposed portion of the surface of the substrate, the method further comprises:
   laminating the substrate with a dielectric layer on each of a front and back side of the substrate.

5. The method for manufacturing a circuit board as claimed in claim 4, wherein the dielectric layer is made of insulating resin material.

6. The method for manufacturing a circuit board as claimed in claim 4, further comprising forming a plurality of through holes in the insulating layer.

7. The method for manufacturing a circuit board as claimed in claim 1, wherein the entire surface of the first wiring layer is directly covered by the insulating layer.

8. The method for manufacturing a circuit board as claimed in claim 1, wherein the insulating layer is not formed directly on either surface of the substrate.

9. The method for manufacturing a circuit board as claimed in claim 1, wherein the substrate is a BT substrate.

10. The method for manufacturing a circuit board as claimed in claim 1, wherein the substrate is an FR4 substrate.

11. The method for manufacturing a circuit board as claimed in claim 2, wherein the photoresist is a dry film.

12. A method for manufacturing a circuit board, comprising:
    providing a substrate;
    forming a first wiring layer on each of a front and a back side of the substrate;
    forming, by electrophoretic deposition, an insulating layer on the first wiring layer, wherein the insulating layer exposes a portion of both the front side and the back side of the substrate;
    forming a second wiring layer directly on both the insulating layer and the exposed portion of both the front side and the back side of the substrate;
    forming a solder mask layer on the second wiring layer; and
    performing a photolithography process to expose a portion of the second wiring layer to form a plurality of contacts.

13. The method of claim 12, wherein the forming the first wiring layer and forming the second wiring layer further comprises:
    forming a metal layer;
    forming a photoresist pattern on the metal layer;
    etching the metal layer; and
    removing the photoresist pattern.

14. The method for manufacturing a circuit board as claimed in claim 13, wherein the metal layer is formed by electroplating or electroless plating.

15. The method for manufacturing a circuit board as claimed in claim 12, wherein the insulating layer is not formed directly on either surface of the substrate.

16. The method for manufacturing a circuit board as claimed in claim 12, wherein the substrate is a BT substrate.

17. The method for manufacturing a circuit board as claimed in claim 12, wherein the substrate is an FR4 substrate.

18. The method for manufacturing a circuit board as claimed in claim 13, wherein the photoresist is a dry film.

19. The method for manufacturing a circuit board as claimed in claim 12, wherein the forming the plurality of contacts comprises forming a Ni/Au layer on the exposed portion of the second wiring layer.

20. The method for manufacturing a circuit board as claimed in claim 12, further comprising forming a plurality of through holes in the insulating layer.

* * * * *